United States Patent
Pornin et al.

(10) Patent No.: US 8,338,282 B2
(45) Date of Patent: Dec. 25, 2012

(54) METHOD FOR ENCAPSULATING A MICROCOMPONENT USING A MECHANICALLY REINFORCED CAP

(75) Inventors: Jean-Louis Pornin, Crolles (FR); Charlotte Gillot, Saint-Egreve (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/019,581

(22) Filed: Feb. 2, 2011

(65) Prior Publication Data

US 2011/0189844 A1 Aug. 4, 2011

(30) Foreign Application Priority Data

Feb. 4, 2010 (FR) ...................................... 10 50781

(51) Int. Cl.
*H01L 21/3213* (2006.01)
*H01L 21/311* (2006.01)

(52) U.S. Cl. ........ 438/584; 438/763; 438/106; 438/121; 257/414; 257/678; 257/E21.305; 257/E21.249

(58) Field of Classification Search .............. 438/48–53, 438/106, 107, 121–127, 584, 763; 257/414–417, 257/678, 700, 704, 710, 724–730, 788, 793, 257/E21.249, E21.305–E21.309, E21.499, 257/E21.502, E21.613, E23.127, E23.18, 257/E23.118, E23.193, E29.324, E31.117, 257/E31.119; 216/11, 13, 37
See application file for complete search history.

(56) References Cited

U.S. PATENT DOCUMENTS

| | | | |
|---|---|---|---|
| 6,454,160 B2 * | 9/2002 | Gueissaz | 228/256 |
| 7,595,209 B1 | 9/2009 | Monadgemi et al. | |
| 8,045,835 B2 * | 10/2011 | Palmateer et al. | 385/147 |
| 2004/0173886 A1 | 9/2004 | Carley | |
| 2006/0065941 A1 * | 3/2006 | Delapierre | 257/414 |
| 2006/0134825 A1 | 6/2006 | DCamp et al. | |
| 2009/0194309 A1 | 8/2009 | Gillot et al. | |
| 2010/0003789 A1 * | 1/2010 | Caplet et al. | 438/124 |
| 2011/0169108 A1 * | 7/2011 | Gardner et al. | 257/417 |

FOREIGN PATENT DOCUMENTS

| | | |
|---|---|---|
| EP | 0 525 764 A2 | 2/1993 |
| EP | 1 101 730 A2 | 5/2001 |
| FR | 2 901 264 | 11/2007 |
| WO | WO 2004/077523 A2 | 9/2004 |

OTHER PUBLICATIONS

U.S. Appl. No. 13/381,241, filed Dec. 28, 2011, Pornin, et al.
French Preliminary Search Report issued Nov. 17, 2010, in Patent Application No. FR 1050781.

\* cited by examiner

*Primary Examiner* — Hsien Ming Lee
*Assistant Examiner* — Walter H Swanson
(74) *Attorney, Agent, or Firm* — Oblon, Spivak, McClelland, Maier & Neustadt, L.L.P.

(57) ABSTRACT

A method for encapsulating a micro component positioned on and/or in a substrate, including: depositing at least one sacrificial material covering the micro component, making a cap covering the sacrificial material, removing the sacrificial material via at least one opening formed through the cap and forming a cavity in which the micro component is positioned, depositing, at least on the cap, at least one layer of plugging material that plugs the at least one opening, and performing a localized deposition of at least one portion of mechanically reinforcing material of the cap, covering at least the cap, wherein the mechanically reinforcing material is not subsequently etched.

10 Claims, 6 Drawing Sheets

METHOD FOR ENCAPSULATING A MICROCOMPONENT USING A MECHANICALLY REINFORCED CAP

TECHNICAL FIELD

The invention relates to the field of micro component encapsulation. The term "micro component" here designates any micro system of the MEMS (microelectromechanical system), NEMS (nanoelectromechanical system), MOEMS (micro-opto-electromechanical system), biochip types, as well as any type of electronic, optical, or opto-electronic component.

BACKGROUND OF THE INVENTION

Encapsulating a micro component consists of enclosing the micro component in a cavity delimited by a cap and by the substrate on which the micro component is made. This cavity is generally hermetically sealed. This encapsulation makes it possible to mechanically protect the micro component, for example during the implementation of steps such as cutting the substrate or molding (putting the micro component in a package). This encapsulation also makes it possible to monitor the atmosphere reigning inside the cavity, for example by introducing a neutral gas therein that will prevent any chemical reaction with the micro component, or by making a vacuum in the cavity.

A first solution for encapsulating the micro components consists of attaching caps, for example machined in a silicon plate, on the substrate including the micro components. These caps are either glued, or brazed at the substrate scale. The micro components thus encapsulated are then separated from each other by cutting the substrate and then assembled on electronic circuits.

This type of encapsulation by attaching caps does, however, have several drawbacks: loss of surface on the substrate due to the adhesion/welding zone necessary to secure the caps to the substrate, complexity of the fastening method used, etc.

One alternative solution to fastening caps consists of making a thin layer packaging (TLP) of the micro components. In this solution, the micro component is first covered by a sacrificial material that is etched in order to form a portion of sacrificial material whereof the volume corresponds to that of the cavity in which the micro component is intended to be encapsulated. A deposition of a thin layer is then done on the sacrificial material. The sacrificial material is then etched, for example via an opening formed through the thin layer, thereby forming a cavity in which the micro component is encapsulated and that is delimited in particular by the cap, i.e. the thin layer.

The production of a TLP is perfectly suited to the encapsulation of MEMS-type sensors and makes it possible to protect the sensitive portions of these sensors from mechanical attacks related to the subsequent steps of cutting, handling, etc.

The TLP is not, however, suitable for the subsequent implementation of a molding step that involves thermomechanical stresses in the vicinity of 100 bars and 200° C. for several tens of seconds, or even several minutes, on the micro components thus encapsulated. However, this molding step is very important in the production of micro components because it makes it possible to provide a finished product, protected from the environment and ready to be integrated using automatic means at a high rate on printed circuits, for example.

Document FR 2 901 264 A1 describes the production of a cap including a membrane reinforced by mechanical reinforcing means made by structuring a summit wall of the membrane, the cap defining the cavity in which the micro component is encapsulated.

Such mechanical reinforcement of the cap is not, however, sufficient for the latter to be able to bear pressures greater than or equal to about 100 bars that correspond to the pressures encountered during implementation of a molding step of the encapsulated micro component.

Document WO 2004/077523 A2 describes the possibility of mechanically reinforcing the cap through one or several depositions of very hard materials through vacuum spraying, forming solid plate layers several micrometers thick covering the entire substrate, these layers having to then be etched to form mechanical reinforcing overcoat layers covering the cap.

The implementation of such a method does, however, reveal several drawbacks: risks of crackling of the cap due to the stress (i.e. the strains) caused by the depositions of mechanical reinforcing materials on large surfaces, deformation of the substrate on which the micro component is formed, etc. Moreover, etching of the layers made is problematic because the type of materials that can be used is limited to materials able to undergo such etching. Lastly, the time to implement such etching can be substantial.

BRIEF DESCRIPTION OF THE INVENTION

Thus there is a need to propose a micro component encapsulation method that does not have the drawbacks of the encapsulation method of the prior art, i.e. making it possible to form a micro component encapsulation structure capable of undergoing the thermomechanical stresses of the subsequent steps of encapsulating the micro component, e.g. the molding and cutting steps, these stresses for example corresponding to pressures greater than or equal to about 100 bars and temperatures greater than or equal to about 200° C., and that do not have the drawbacks related to the solid plate depositions of layers of very hard materials on the encapsulation structure.

To that end, the present invention proposes a method for encapsulating a micro component positioned on and/or in a substrate, including at least the following steps:

depositing at least one sacrificial material covering the micro component, making a cap covering the sacrificial material, removing the sacrificial material via at least one opening formed through the cap, forming a cavity in which the micro component is positioned, depositing, at least on the cap, at least one layer of plugging material capable of plugging the opening, localized deposition of at least one portion of mechanically reinforcing material of the cap, covering at least the cap.

The term "localized deposition" designates a deposition such that the material serving to mechanically reinforce the cap is deposited only at the desired location(s) to perform a mechanical reinforcement of the cap, and which therefore does not require the subsequent implementation of etching to remove portions of the mechanically reinforcing material thus deposited.

Such an encapsulation method makes it possible, relative to a traditional encapsulation method of the TLP type, to mechanically reinforce the cap by locally depositing at least one portion of mechanically reinforcing material that may be of the polymer or metal type, e.g. an epoxy resin or copper.

Such a localized deposition of the portion of mechanically reinforcing material has the advantage, relative to a solid plate deposition, of reducing the stress (i.e. the stresses) caused by the deposition of the mechanically reinforcing material and not deforming the substrate and/or the cap under the pressure due to the stresses of the mechanically reinforcing material as is the case for solid plate layers deposited on the substrate assembly. Moreover, given the fact that the portion of mechanically reinforcing material is formed by a localized deposition, this encapsulation method therefore does not require implementation of the subsequent etching step, thereby eliminating the problems related to the time needed to perform such etching steps and enabling the use of materials that are difficult or impossible to etch.

Whatever the localized deposition technique used (e.g. electrolytic growth, serigraphy, or syringe deposition), it is possible to make a portion of mechanically reinforcing material with a substantial thickness, for example several tens of micrometers, and without causing a deformation of the cap.

Moreover, the localized deposition techniques implemented in such an encapsulation method can be implemented using traditional microelectronics means, and therefore allow the method to be implemented quickly without creating additional costs.

The layer of plugging material may comprise only one layer or several layers. Moreover, the layer(s) of plugging material may also be used as bonding layer(s) and/or layer(s) for the preparation of the localized deposition of the mechanically reinforcing material (for example enabling the making of an electrolytic growth of the mechanically reinforcing material).

The localized deposition may be chosen among electrolytic growth when the mechanically reinforcing material is a metal material, or serigraphy or syringe deposition when the mechanically reinforcing material is a polymer or solder paste. The localized deposition in that case corresponds to the implementation of one of these deposition techniques.

The term "metal material" designates an electrically conductive metal or metal alloy that can be obtained by electrolytic growth, and therefore does not designate compounds such as metal oxides or nitrides.

The mechanically reinforcing material may have a Young's modulus below about 150 GPa. Such a mechanically reinforcing material may be copper whereof the Young's modulus is between about 110 GPa and 120 GPa. Such materials do not create any degradation of the elements on which the portion of mechanically reinforcing material is deposited. The portion of mechanically reinforcing material may in particular be made in the form of a single layer. Moreover, the mechanically reinforcing material used may in particular be chosen to be rigid enough at the temperature at which a subsequent molding is done that it is not necessary to deposit an overly significant thickness of mechanical reinforcing material. The mechanical reinforcing material, for example an epoxy resin, may have glass temperature higher than the molding temperature. The mechanically reinforcing material may comprise copper (Young's modulus equal to about 110 GPa) and/or gold (Young's modulus equal to about 75 GPa) and/or nickel and/or an epoxy resin of the polymer type and/or a solder paste.

The surface loss on the substrate and/or the layer of plugging material for supporting the portion of mechanically reinforcing material, created by making the portion of mechanically reinforcing material through a localized deposition, is low, e.g. below or in the vicinity of the deposited thickness of the mechanical reinforcing material. Thus, the portion of mechanically reinforcing material may also be deposited on a zone of the substrate and/or of the layer of plugging material, said zone being able to be peripheral to the cap, such that a maximum distance between an outer boundary of said zone and the cap may be between about 5 μm and 100 μm. Thus, such a support zone of the portion of mechanically reinforcing material with limited dimensions makes it possible to limit the surface area lost around the cavity.

The thickness of the portion of mechanically reinforcing material may be between about 10 μm and 50 μm, or between about 15 μm and 30 μm, when the mechanically reinforcing material is a metal material, or between about 20 μm and 50 μm when the mechanically reinforcing material is a polymer. Such thicknesses are compatible with the miniaturization of microelectronic components done by performing a thinning: the localized deposition of the portion of mechanically reinforcing material may thus remain within the limit of the height used for the cabling of the micro component, i.e. about 50 μm.

The encapsulation method may also include, between the step for depositing the layer of plugging material and the localized deposition step, a step for delimiting a zone of at least the layer of plugging material, e.g. a zone of the layer of plugging material and possibly the substrate, with a pattern similar to a pattern of the portion of mechanically reinforcing material.

Such delimitation may be obtained:

either by using a mask, e.g. resin-based, formed on the plugging layer and possibly the substrate, and having one or several openings corresponding to zones where the portion of mechanically reinforcing material must be formed, the mask being able to be eliminated after the localized deposition of the portion of mechanically reinforcing material, or through the use of an electrically conductive adhesion layer and a layer of material, e.g. a metal material, enabling the electrolytic growth of the mechanically reinforcing material, this layer being able to include a pattern similar to that of the portion of mechanically reinforcing material intended to be made on said zone, or by using an electrically conductive adhesion layer and a layer of material, e.g. a metal material, enabling the electrolytic growth of the mechanically reinforcing material, this metal layer being etched or not, and a mask, for example resin-based, formed on the metal layer and comprising one or several openings whereof the patterns correspond to zones where the mechanically reinforcing material must be made.

When the mechanically reinforcing material is a metal material, the localized deposition step may be obtained at least by carrying out the following steps:

depositing a first layer based on, or comprising, at least one material able to form an electrically conductive adhesion layer (also called catching layer or seed layer, serving as current lead layer) for the electrolytic growth of the mechanically reinforcing material, on the cap and at least part of the substrate and/or the layer of plugging material around the cap, depositing a second layer based on, or comprising, said metal material or another material compatible with an electrolytic growth of the mechanically reinforcing material, on the first layer, etching the second layer according to a pattern similar to that of the portion of mechanically reinforcing material intended to be made, electrolytic growth of the mechanically reinforcing material on at least one remaining portion of the second layer, etching the first layer according to a pattern similar to that of the portion of mechanically reinforcing material.

The implementation of a localized deposition by electrolytic growth does not require a subsequent etching step of the reinforcing material thus deposited and makes it possible to obtain significant thicknesses of material, which can go up to several tens of micrometers for a monolithic layer.

Moreover, such a method does not involve the use of a thick resin to localize the deposited material.

In one alternative, when the mechanically reinforcing material is a metal material, the layer of plugging material may be based on, or comprise, at least one material able to form an electrically conductive adhesion layer for the electrolytic growth of the mechanically reinforcing material, the localized deposition step being able to be obtained at least by carrying out the following steps:

depositing a layer based on, or comprising, said metal material or another material compatible with an electrolytic growth of the mechanically reinforcing material, on the layer of plugging material, etching the layer based on, or comprising, said metal material according to a pattern similar to that of the portion of mechanically reinforcing material intended to be made, electrolytic growth of the mechanically reinforcing material on at least one remaining portion of the layer based on, or comprising, said metal material, etching the layer of plugging material according to a pattern similar to that of the portion of mechanically reinforcing material.

In this case, the layer of plugging material and/or the layer based on, or comprising, said metal material may be obtained by performing vacuum evaporation depositions.

Such an alternative therefore makes it possible to perform an encapsulation, for example a vacuum encapsulation, of the micro component while only using a single layer to perform both the plugging of the opening(s) formed in the cap and the electrically conductive adhesion layer for the subsequent electrolytic growth of the mechanically reinforcing material. In another alternative, it is also possible for the plugging material also to be the material forming the electrically conductive adhesion layer for the electrolytic growth, but for its deposition to be done using techniques other than vacuum evaporation, e.g. cathode sputtering.

In another alternative, when the mechanically reinforcing material is a metal material and when the plugging layer is based on, or comprises, at least one material able to form an electrically conductive adhesion layer for the electrolytic growth of the mechanically reinforcing material deposited by vacuum evaporation, the localized deposition step may be obtained at least by carrying out the following steps:

depositing, by vacuum evaporation, a layer based on, or comprising, said metal material, on the layer of plugging material, etching the layer based on, or comprising, said metal material according to a pattern similar to that of the portion of mechanically reinforcing material intended to be made, depositing a layer of resin whereof the thickness is substantially in the order of magnitude of, or for example substantially equal to, the thickness of the portion of mechanically reinforcing material intended to be made, on the layer based on, or comprising, said metal material and the substrate, making at least one opening through the resin according to a pattern corresponding to that of the portion of mechanically reinforcing material intended to be made, electrolytic growth of the mechanically reinforcing material on at least one remaining portion of the layer based on, or comprising, said metal material, through the opening formed in the layer of resin, removing the layer of resin, etching the layer of plugging material according to a pattern similar to that of the portion of mechanically reinforcing material.

Such an alternative makes it possible to improve the localization precision and to reduce the bulk, or size, of the portion of mechanically reinforcing material on the substrate.

The encapsulation method may also include, when the mechanically reinforcing material is a polymer, e.g. deposited locally by serigraphy or by syringe deposition, after carrying out the localized deposition step, carrying out a step for annealing the portion of mechanically reinforcing material, e.g. at about 150° C. for 1 hour when the mechanically reinforcing material is an epoxy resin.

A localized deposition by serigraphy in particular has the advantage of being able to be carried out in a single step. Moreover, the materials chosen to form the portion of mechanically reinforcing material can be easily changed, and in particular be chosen among inexpensive materials (in particular because these materials do not need to be photosensitive or etchable).

The encapsulation method may also include the implementation of several steps for localized deposition of mechanically reinforcing materials such that the portion of mechanically reinforcing material is formed by a stack of several layers of mechanically reinforcing materials.

The method may also be carried out to make several structures respectively including several caps, each cap having a mechanically reinforcing layer.

BRIEF DESCRIPTION OF THE DRAWINGS

The present invention will be better understood upon reading the description of embodiments provided solely for information and non-limitingly in reference to the appended drawings in which.

Identical, similar or equivalent parts of the different figures described below bear the same numerical references so as to facilitate the transition from one figure to the next.

The different parts shown in the figures are not necessarily shown according to a uniform scale, to make the figures more legible.

The different possibilities (alternatives and embodiments) must be understood as not being mutually exclusive and can be combined with each other.

DETAILED DESCRIPTION OF SPECIFIC EMBODIMENTS

FIGS. 1A to 1E show the steps of a method for encapsulating a micro component 100, for example of the MEMS type, according to a first embodiment. This first embodiment is particularly adapted to cases where the mechanically reinforcing material used is metal.

Figure 1A:
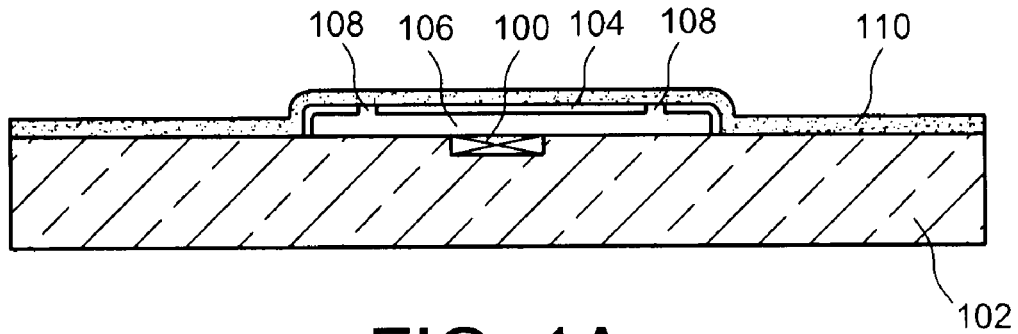
FIGS. 1A to 1E show the steps of a method for encapsulating a micro component according to a first embodiment.

As shown in FIG. 1A, the micro component 100 is first made on a substrate 102, for example based on, or comprising, a semiconductor such as silicon. A cap 104, the edges of which rest on the substrate 102, forms a cavity 106 in which the micro component 100 is encapsulated. This cap 104 and this cavity 106 are for example obtained by carrying out a traditional method of the TLP type. To that end, the micro component 100 is first covered with a layer of a sacrificial material, for example based on, or comprising, a spin-on deposited polymer, which is then etched so that a remaining portion of the sacrificial material substantially occupies the volume of the future cavity 106. This portion of sacrificial material is then covered with a thin layer, e.g. based on, or comprising, a dielectric material such as $SiO_2$, $SiO_x$ or SiN, and having a thickness between about 1 µm and 10 µm, deposited for example by CVD (chemical vapor deposition), which is then etched to form the cap 104. The cap 104 is then pierced, forming openings 108 through which the sacrificial material is removed. This removal of the sacrificial material then forms the cavity 106. The openings 108 are lastly plugged by depositing a layer of plugging material 110, for example with a thickness between about 1 µm and 10 µm and based on, or comprising, polymer or a dielectric material deposited by CVD, covering the cap 104 and the portions of the substrate 102 located around the cap 104.

Figure 1B:
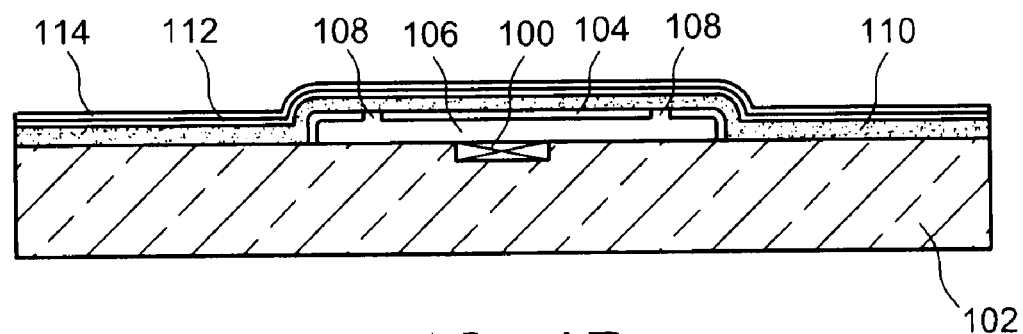

Preparation layers are then formed to perform a localized growth of a mechanically reinforcing material. To that end, a fine layer 112, e.g. with a thickness equal to about 100 nm or between about 100 nm and 1 µm, and based on, or comprising, a metal material such as titanium, is deposited on the plugging layer 110. This layer 112 is in turn covered with a fine layer 114, e.g. with a thickness equal to about 100 nm or between about 100 nm and 1 µm, based on, or comprising, copper and/or nickel (FIG. 1B). These layers 112 and 114 are for example deposited by cathode sputtering or vacuum evaporation. The material of the layer 114, here copper, corresponds to the mechanically reinforcing material that will be used to consolidate the cap 104. The material of the layer 114 is chosen so that the layer 114 forms a growth layer for the subsequent localized deposition of the mechanically reinforcing material.

Figure 1C:
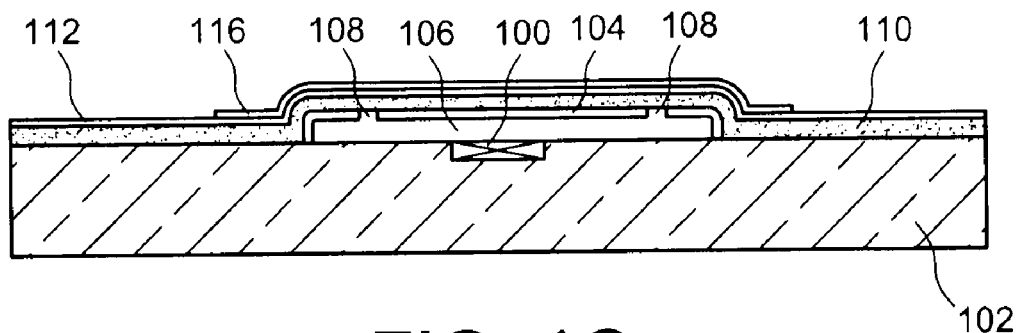

As shown in FIG. 1C, the copper-based layer 114 is etched so that a remaining portion 116 of that layer 114 delimits a location of the mechanically reinforcing material that will be deposited afterwards.

Figure 1D:
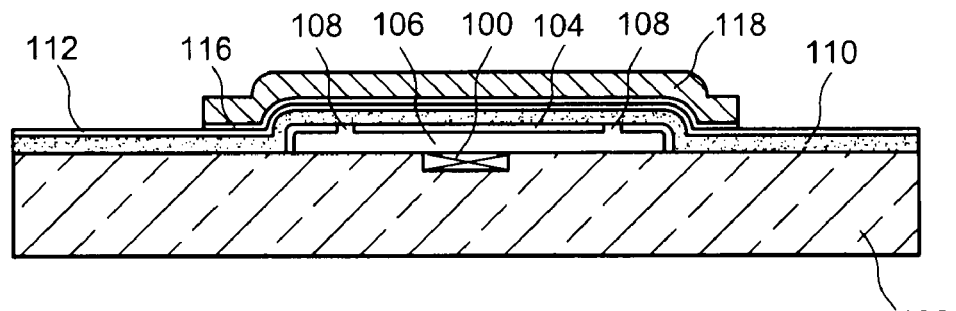

The portion of mechanically reinforcing material 118, here copper, is then made by electrolytic growth on a thickness between about 10 µm and 50 µm (FIG. 1D). Such a deposition forms a mechanically reinforcing material whereof the Young's modulus is equal to about 110 GPa. Performing a deposition by electrolytic growth makes it possible to localize the deposition only on the remaining portion 116 of the layer 114 previously etched. It is therefore shown that the etching pattern of the layer 114 made in the preceding step defines the surface on which the portion of mechanically reinforcing material is deposited afterwards. The growth of the portion of mechanically reinforcing material 118 takes place not only vertically, i.e. perpendicular to the planes of the layers 112 and 114 (and perpendicular to a primary face of the substrate 102 on which the cap 104 is formed), but also horizontally, i.e. in a direction parallel to the planes of the layers 112 and 114, corresponding to a direction parallel to a primary face of the substrate 102 on which the cap 104 is formed. The thickness made to grow vertically corresponds to the horizontal growth dimension. Thus, the portion of mechanically reinforcing material 118 can exceed the portion 116 and be located above a portion of the substrate 102 not covered by the portion 116.

Figure 1E:
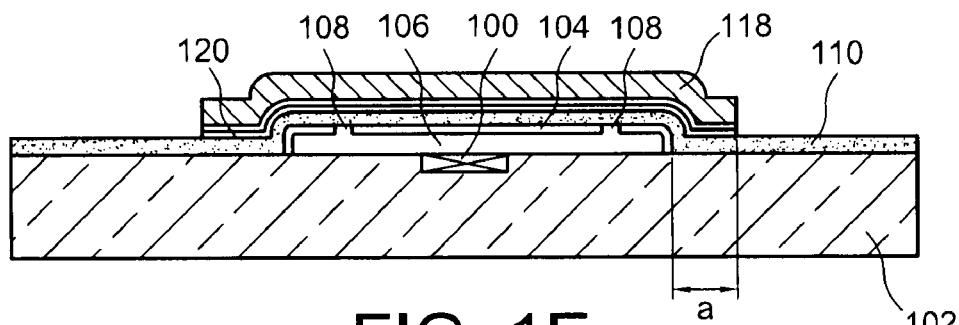

The encapsulation of the device 100 is completed by etching the portions of the growth layer 112 not covered by the portion of mechanically reinforcing material 118 (FIG. 1E). The portion of mechanically reinforcing material may serve as a mask during that etching. Thus, a remaining portion 120 of the growth layer 112 is positioned under the portion of the mechanically reinforcing material 118.

If one wishes for the micro component 100 to be vacuum encapsulated, it is possible to perform, in place of the deposition of the plugging layer 110, a vacuum evaporation deposition of the layers of titanium 112 and copper 114 directly on the cap 104, the openings 108 then being plugged by the layers of titanium 112 and copper 114. Moreover, it is possible for the openings 108 to be plugged by the layers of titanium 112 and copper 114 without the depositions done being vacuum evaporation depositions. Lastly, it is also possible to omit the layer of titanium 112 and to make only the layer 114 forming the catching layer serving for growth of the portion of mechanically reinforcing material 118, whether or not the plugging layer 110 is present.

The surface occupied by the portion of mechanically reinforcing material 118 around the cavity 106 is relatively small. Dimension "a" shown in FIG. 1E, which corresponds to the space occupied on the substrate 102 around the cavity 106 by the portion of mechanically reinforcing material 118, may for example be substantially equal to (or greater than, when the growth also occurs horizontally) the deposited thickness of mechanically reinforcing material 118.

In one alternative, the portion of mechanically reinforcing material 118 may be obtained by carrying out several successive electrolytic growths of several layers of metal materials that may be different from each other. Each of these layers may have a thickness equal to about 10 µm.

FIGS. 2A to 2D show the steps of a method for encapsulating the micro component 100 according to a second embodiment. This second embodiment is particularly adapted to cases where the mechanically reinforcing material used is a polymer or a solder paste, or solder cream, for example comprising a metal alloy such as a tin-based alloy.

Figure 2A:
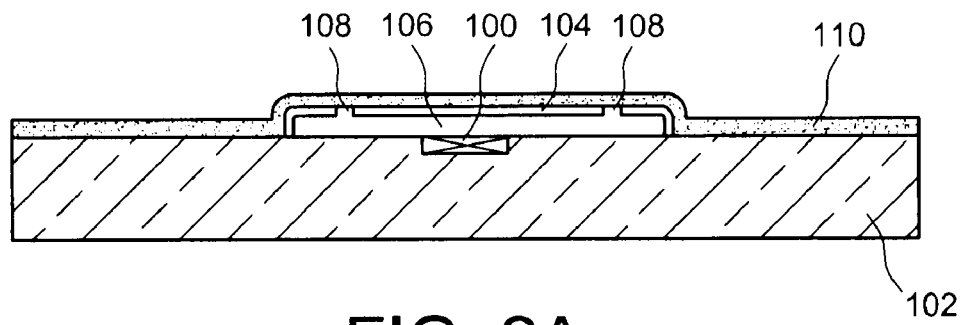
FIGS. 2A to 2D show the steps of a method for encapsulating a micro component according to a second embodiment.

As shown in FIG. 2A, and similarly to FIG. 1A previously described, the micro component 100 is first made on the substrate 102, and the cap 104, the edges of which rest on the substrate 102, forms the cavity 106 in which the micro component 100 is encapsulated. The cap 104 includes openings 108 made to remove the sacrificial material used to form the cap 104. These openings 108 are plugged by the layer of plugging material 110 that covers the cap 104 and the portions of the substrate 102 located around the cap 104.

Figure 2B:
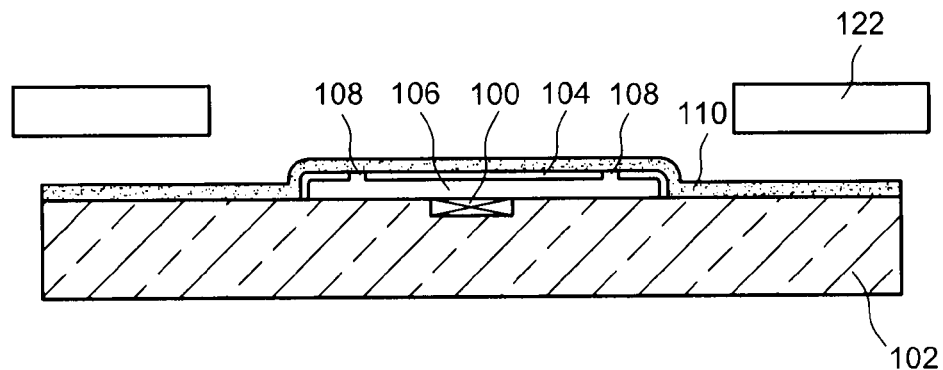

A serigraphy mask 122 is then positioned above the assembly previously made (FIG. 2B). The pattern of the mask 122 corresponds to the pattern of the portion of mechanically reinforcing material intended to reinforce the cap 104.

Figure 2C:
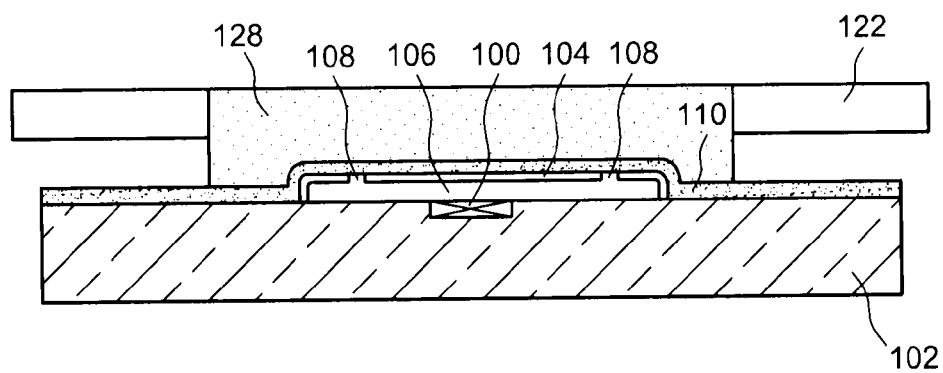

As shown in FIG. 2C, a portion of mechanically reinforcing material 128, here polymer-based, is then deposited through the serigraphy mask 122. The deposited thickness of the reinforcing material 128 is for example several tens of micrometers, and for example between about 10 µm and 50 µm.

Figure 2D:
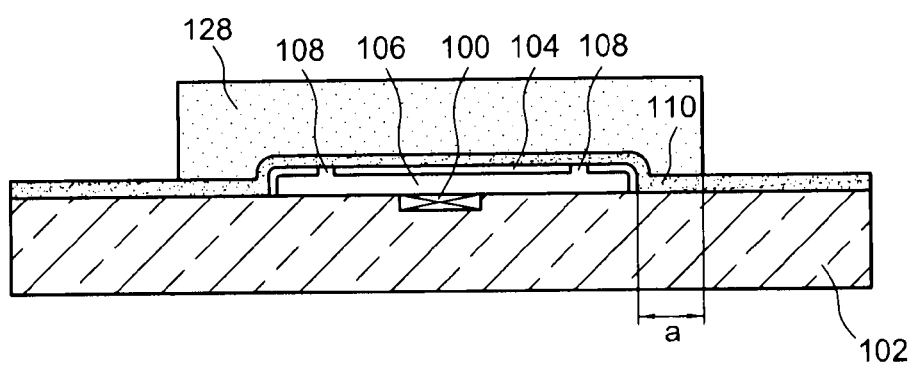

Lastly, the serigraphy mask 122 is removed (FIG. 2D). The portion of mechanically reinforcing material 128 is then annealed.

The surface area occupied by the portion of mechanically reinforcing material 128 around the cavity 106 is still relatively small here. Dimension "a" shown in FIG. 2D, which corresponds to the space occupied on the substrate 102 around the cavity 106 by the reinforcing material 128, may for example be substantially equal to the deposited thickness of the reinforcing material 118, i.e. for example between about 10 µm and 50 µm.

Figure 3A:
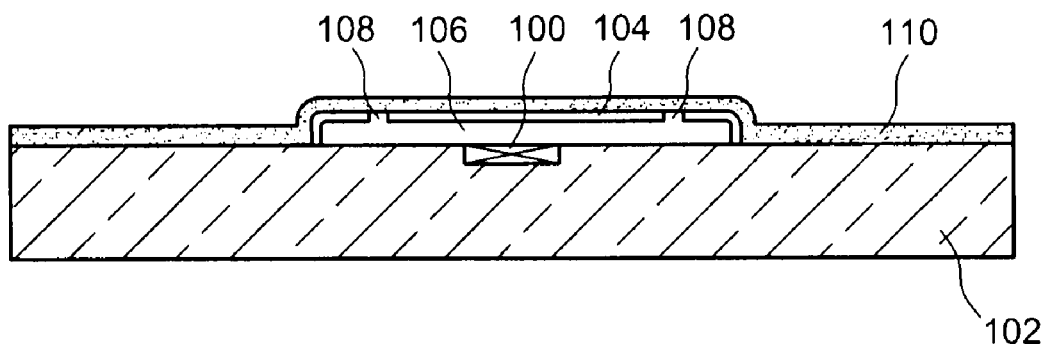
FIGS. 3A and 3B show the steps of a method for encapsulating a micro component according to a third embodiment.
Figure 3B:
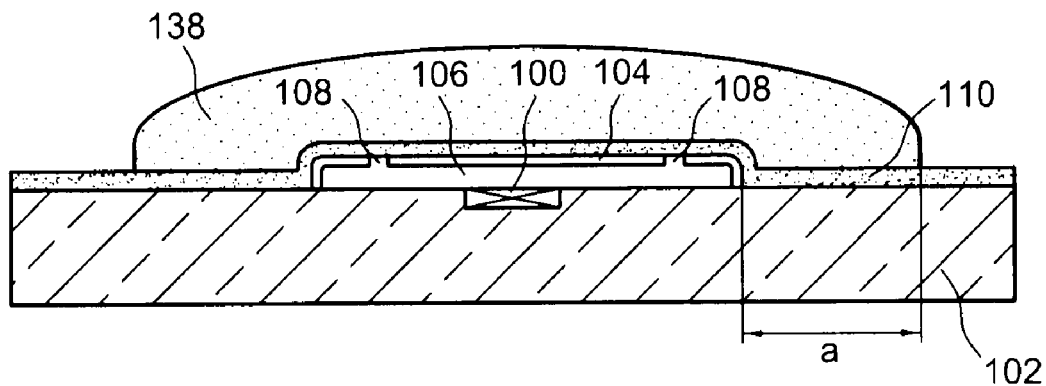

FIGS. 3A and 3B show the steps of a method for encapsulating the micro component 100 according to a third embodiment. This third embodiment is particularly adapted to cases where the mechanically reinforcing material used is of the polymer type, for example in the form of an epoxy resin, or a solder paste, or a solder cream, for example comprising a tin-based alloy.

As shown in FIG. 3A, and similarly to FIGS. 1A and 2A previously described, the micro component 100 is made on the substrate 102 beforehand, and the cap 104, the edges of which rest on the substrate 102, forms the cavity 106 in which the micro component 100 is encapsulated. The cap 104 includes the openings 108 making it possible to remove the sacrificial material used to form the cap 104. These openings 108 are plugged here by the layer of plugging material 110 that covers the cap 104 and the portions of the substrate 102 located around the cap 104.

As shown in FIG. 3B, a portion of mechanically reinforcing material 138 is deposited on the cap 104 and the layer of plugging material 110 in the form of a drop calibrated using a syringe and a needle. The portion of mechanically reinforcing material 138 is then annealed.

The surface area occupied by the portion of mechanically reinforcing material 138 around the cavity 106 is relatively small here again. Dimension "a" shown in FIG. 3B, which corresponds to the space occupied on the substrate 102 around the cavity 106 by the portion of mechanically reinforcing material 138, will for example be between about several tens of micrometers (20 μm for example) and 100 μm. This encapsulation method according to this third embodiment will be more adapted to an encapsulation of micro components including a certain available surface area around the cavity and that does not require precise positioning of the reinforcing material.

The polymer-type material used to make the portions of mechanically reinforcing material 128 and 138 may be chosen such that it has a glass transition point (Tg) greater than the molding temperature that the encapsulated micro component 100 is intended to undergo, so as not to deform excessively during the polymerization cycle of the molding resin. A thickness of the mechanically reinforcing materials 128 and 138 in the vicinity of 50 μm deposited on the micro system 100 is well adapted to that. Moreover, polymer materials charged with a metal or mineral powder may also be used to form the portions of mechanically reinforcing material 128 or 138.

Figure 4:
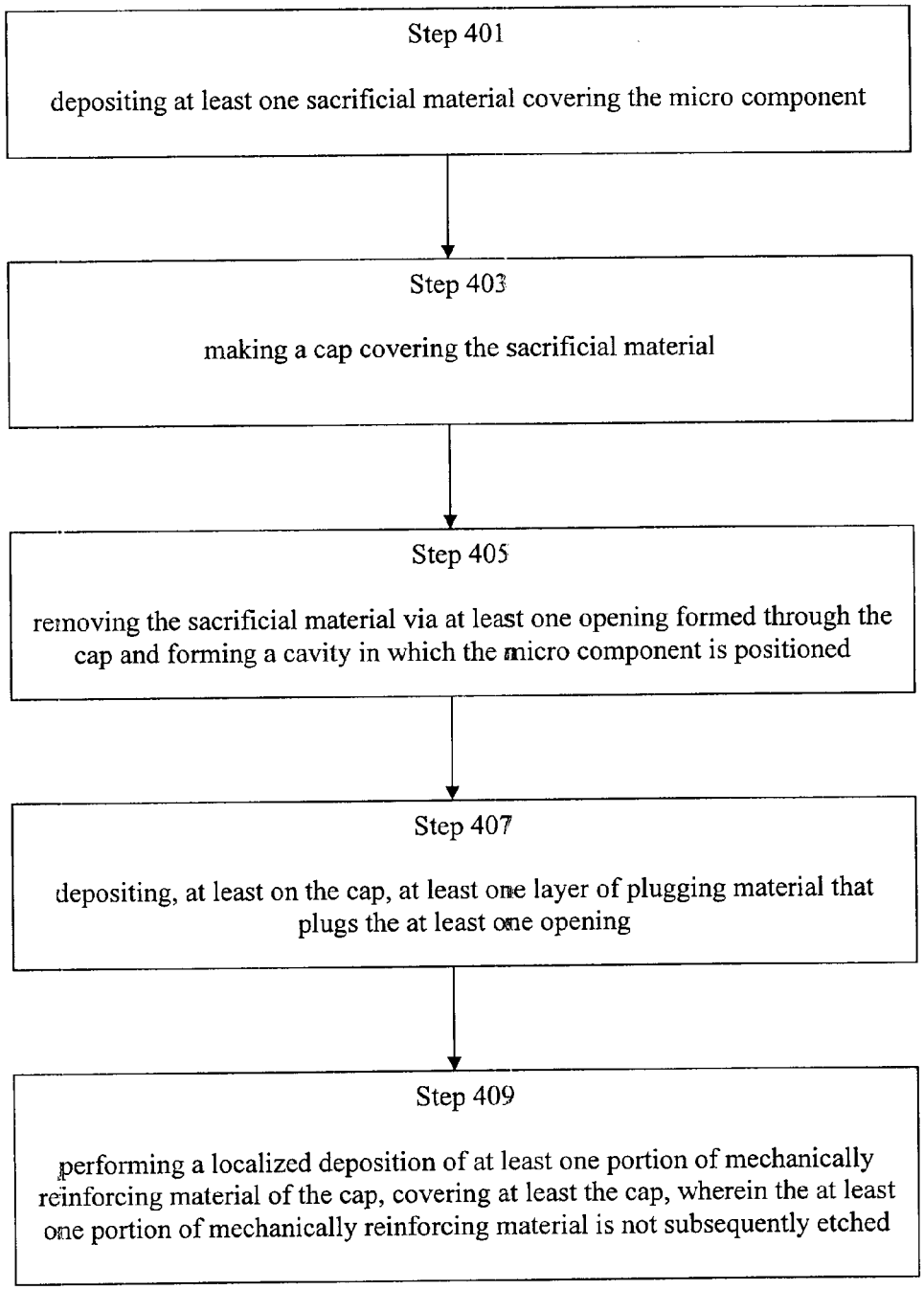
FIG. 4 is a flow chart illustrating a method for encapsulating a micro component.

FIG. 4 is a flow chart illustrating a method for encapsulating a micro component. Step 401 includes depositing at least one sacrificial material covering the micro component. Step 403 includes making a cap covering the sacrificial material. Step 405 includes removing the sacrificial material via at least one opening formed through the cap and forming a cavity in which the micro component is positioned. Step 407 includes depositing, at least on the cap, at least one layer of plugging material that plugs the at least one opening. Step 409 includes performing a localized deposition of at least one portion of mechanically reinforcing material of the cap, covering at least the cap, wherein the at least one portion of mechanically reinforcing material is not subsequently etched.

Figure 5:
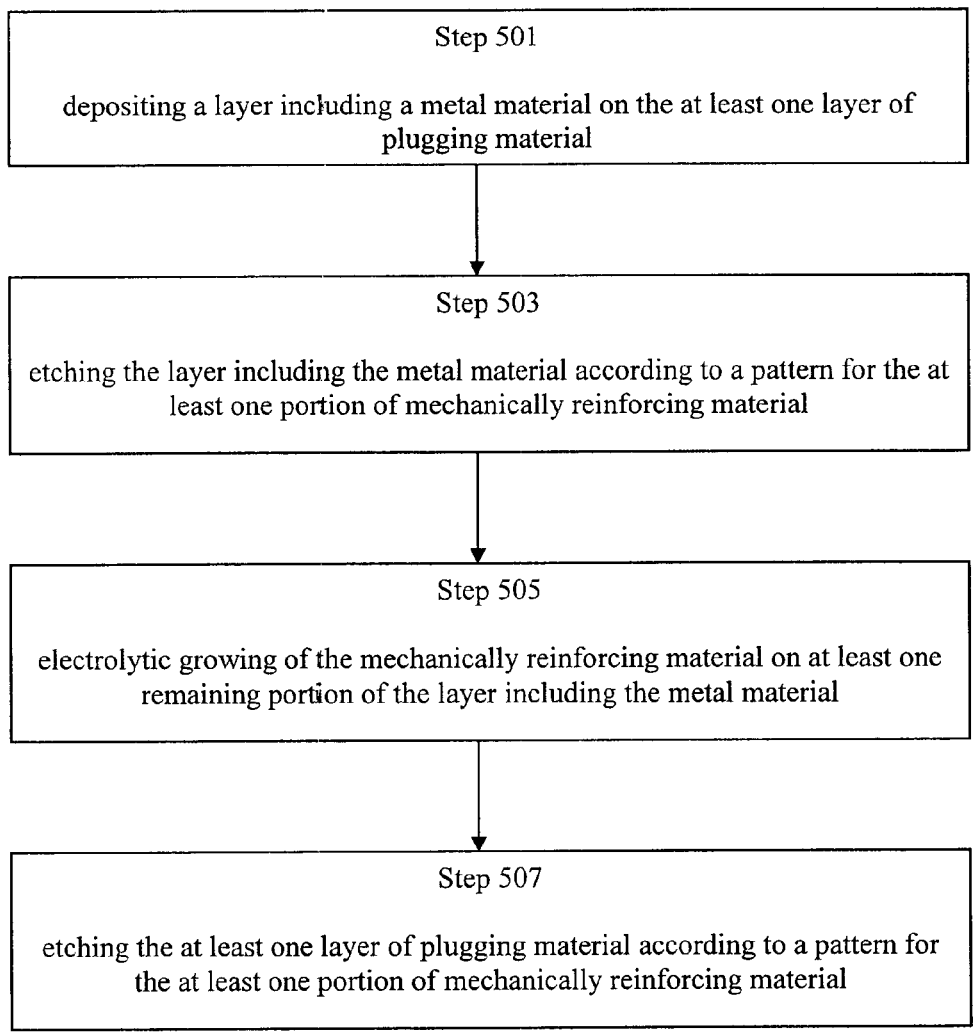
FIG. 5 is a flow chart illustrating a method of performing localized deposition when the layer of plugging material is based on at least one material able to form a seed layer for the electrolytic growth of the mechanically reinforcing material.

FIG. 5 is a flow chart illustrating a method of performing localized deposition. Step 501 includes depositing a layer including a metal material on the at least one layer of plugging material. Step 503 includes etching the layer including the metal material according to a pattern for the at least one portion of mechanically reinforcing material. Step 505 includes electrolytic growing of the mechanically reinforcing material on at least one remaining portion of the layer including the metal material. Step 507 includes etching the at least one layer of plugging material according to a pattern for the at least one portion of mechanically reinforcing material.

The invention claimed is:

1. A method for encapsulating a micro component positioned on and/or in a substrate, comprising:
    depositing at least one sacrificial material covering the micro component,
    making a cap covering the sacrificial material,
    removing the sacrificial material via at least one opening formed through the cap and forming a cavity in which the micro component is positioned,
    depositing, at least on the cap, at least one layer of plugging material that plugs the at least one opening, and
    performing a localized deposition of at least one portion of mechanically reinforcing material of the cap, covering at least the cap, wherein the mechanically reinforcing material is not subsequently etched,
    wherein the performing the localized deposition includes performing electrolytic growth when the mechanically reinforcing material is a metal material, and performing serigraphy or syringe deposition when the mechanically reinforcing material is a polymer or solder paste.

2. The encapsulation method according to claim 1, wherein the mechanically reinforcing material has a Young's modulus below about 150 GPa.

3. The encapsulation method according to claim 1, wherein the mechanically reinforcing material comprises one or more of copper, gold, nickel, or an epoxy resin of one or more of a polymer or a solder paste.

4. The encapsulation method according to claim 1, wherein the at least one portion of mechanically reinforcing material is also deposited on one or more of a zone of the substrate or of the layer of plugging material, said zone being peripheral to the cap, such that a maximum distance between an outer boundary of said zone and the cap is between about 5 μm and 100 μm.

5. The encapsulation method according to claim 1, wherein a thickness of the at least one portion of mechanically reinforcing material is between about 10 μm and 50 μm when the mechanically reinforcing material is a metal material, or between about 20 μm and 50 μm when the mechanically reinforcing material is a polymer.

6. The encapsulation method according to claim 1, also including, between the depositing the at least one layer of plugging material and the performing the localized deposition, delimiting a zone of at least the layer of plugging material with a pattern for the at least one portion of mechanically reinforcing material.

7. The encapsulation method according to claim 1, wherein, when the mechanically reinforcing material is a metal material, the performing the localized deposition comprises:
    depositing a first layer including at least one material able to form an electrically conductive adhesion layer for electrolytic growth of the mechanically reinforcing material, on the cap and at least part of the substrate or the layer of plugging material around the cap,
    depositing a second layer including said metal material on the first layer,
    etching the second layer according to a pattern for the at least one portion of mechanically reinforcing material intended to be made,
    electrolytic growing of the mechanically reinforcing material on at least one remaining portion of the second layer, and
    etching the first layer according to a pattern of the at least one portion of mechanically reinforcing material.

8. The encapsulation method according to claim 1, wherein, when the mechanically reinforcing material is a metal material, the layer of plugging material being based on at least one material able to form an electrically conductive adhesion layer for electrolytic growth of the mechanically reinforcing material, the performing the localized deposition comprising:

depositing a layer including said metal material on the at least one layer of plugging material, etching the layer including said metal material according to a pattern for the at least one portion of mechanically reinforcing material, electrolytic growing of the mechanically reinforcing material on at least one remaining portion of the layer including said metal material, and etching the at least one layer of plugging material according to the pattern for the at least one portion of mechanically reinforcing material.

9. The encapsulation method according to claim 1, also including, when the mechanically reinforcing material is a polymer, after the performing the localized deposition, annealing the at least one portion of mechanically reinforcing material.

10. The encapsulation method according to claim 1, wherein the performing the localized deposition includes forming a stack of several layers of mechanically reinforcing materials.

* * * * *